Figure 1:
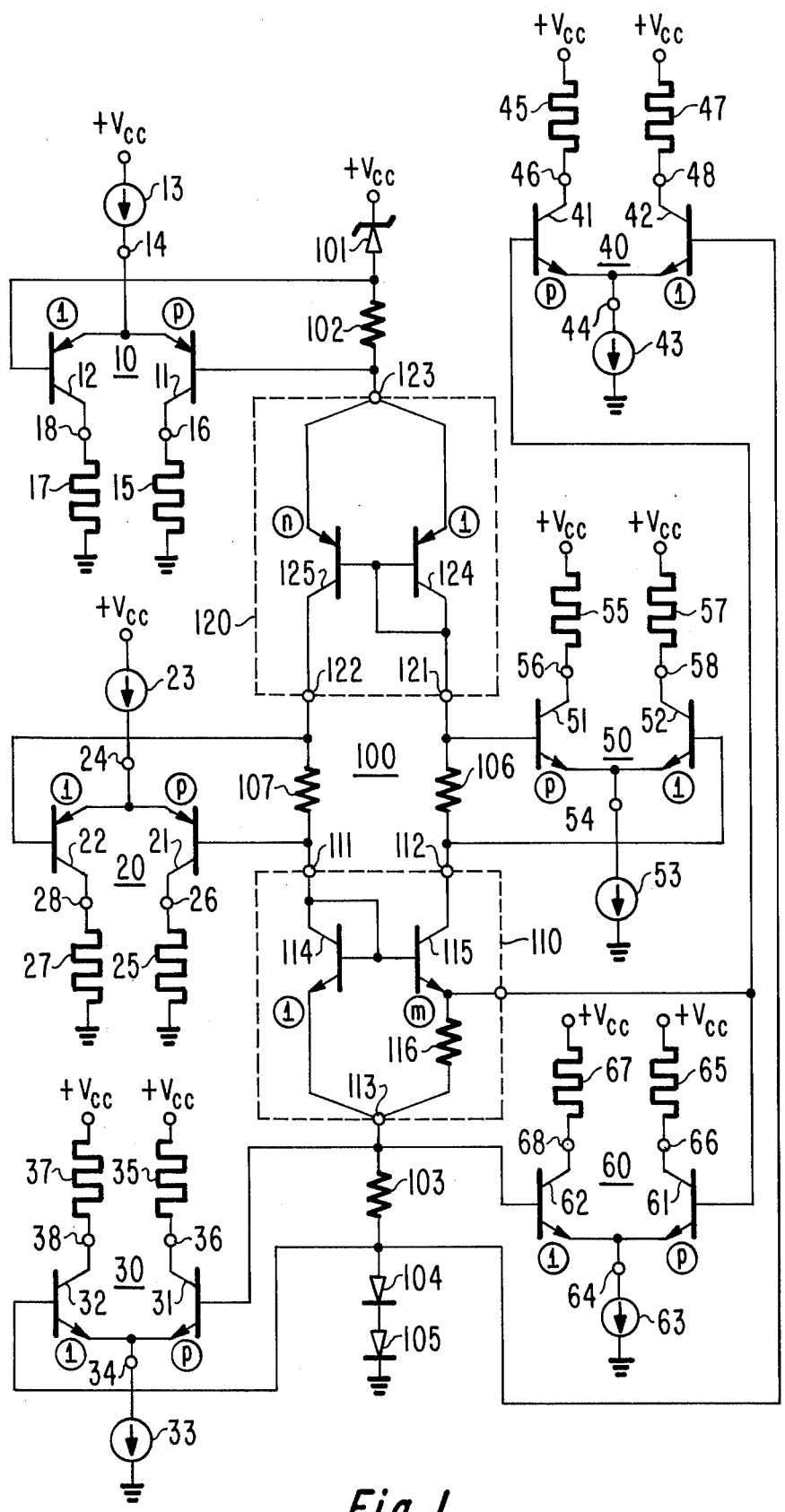

United States Patent [19]

Crowle

[11] 4,025,842
[45] May 24, 1977

[54] CURRENT DIVIDER PROVIDED TEMPERATURE-DEPENDENT BIAS POTENTIAL FROM CURRENT REGULATOR

[75] Inventor: Brian Crowle, Ashford, England

[73] Assignee: RCA Corporation, New York, N.Y.

[22] Filed: Jan. 7, 1976

[21] Appl. No.: 646,961

[30] Foreign Application Priority Data

Feb. 24, 1975 United Kingdom ............... 7658/75
Aug. 6, 1975 United Kingdom ............... 7658/75

[52] U.S. Cl. .................................. 323/19; 307/297;
323/9; 323/69; 330/30 D
[51] Int. Cl.² ...................... G01K 7/00; G05F 3/08
[58] Field of Search .................. 323/1, 4, 9, 19, 68,
323/69; 307/296, 297, 53, 55; 330/30 D, 26

[56] References Cited

UNITED STATES PATENTS

| | | | |
|---|---|---|---|
| 3,851,241 | 11/1974 | Wheatley, Jr. | 323/19 |
| 3,867,685 | 2/1975 | Ahmed | 323/4 |
| 3,908,162 | 9/1975 | Marley et al. | 323/19 |
| 3,914,683 | 10/1975 | Van de Plassche | 330/30 D |
| 3,914,684 | 10/1975 | Leidich | 323/4 |
| 3,930,172 | 12/1975 | Dobkin | 307/297 |

*Primary Examiner*—Gerald Goldberg
*Attorney, Agent, or Firm*—H. Christoffersen; S. Cohen; A. L. R. Limberg

[57] ABSTRACT

A pair of similar conductivity transistors operated at substantially the same temperature T are connected as a current divider. A common terminal to which their emitter electrodes are each connected receives an input current to be apportioned between the emitter-to-collector paths of the transistors, these separate currents flowing to respective branch terminals at the respective collector electrodes of this transistor. The base electrodes of the transistors are connected to opposite ends of a resistive element. A current responsive to T is caused to flow through the resistive element to cause a potential drop substantially proportionally responsive to T between its opposite ends, biasing the transistors relative to each other so as to apportion the input current to the branch terminals in an invariant ratio. The means for developing the temperature responsive current may include a current regulator comprising a regenerative feedback loop connection of a pair of current amplifiers, one of which exhibits decreasing gain with increased level of current supplied to its input circuit.

11 Claims, 7 Drawing Figures

CURRENT DIVIDER PROVIDED TEMPERATURE-DEPENDENT BIAS POTENTIAL FROM CURRENT REGULATOR

The present invention is directed to current dividers of a nature suitable for construction in a monolithic integrated circuit.

U.S. Pat. No. 3,867,685 issued Feb. 18, 1975 to A.A.A. Ahmed and entitled "Fractional Current Supply" describes a current divider of the same general type as the current divider of the present invention. The Ahmed current divider useds a pair of similar conductivity type transistors operated at substantially the same temperature T, their emitter electrodes being connected to the common terminal of the current divider and their respective collector electrodes to separate ones of the branch terminals of the current divider. A potential proportional to T is applied between the base electrodes of the transistors to maintain their collector-to-emitter (or emitter-to-collector) current flows in fixed ratio. Ahmed derived this potential proportional to T as the difference in offset potentials across two chains containing equal numbers of serially connected self-biased transistors operated at a temperature substantially equal to T, the self-biased transistors in the one chain being forward-biased by a current in fixed proportion to a current forward-biasing the self-biased transistors in the other chain.

The present invention concerns such a current divider using alternative apparatus for deriving the potential proportional to T. The alternative apparatus comprises a resistive element and means for supplying a current responsive to T connected between the first and second ends of this resistive element to develop a potential proportionally responsive to T between its first and second ends. When substantial current division ratios are sought, current dividers according to the present invention can be integrated in less die area than prior-art current dividers. Considerably more flexibility is afforeded with regard to the biasing of the current divider terminals with respect to the power supply voltages, and small power supply voltages are more easily accomodated.

Figure 2:
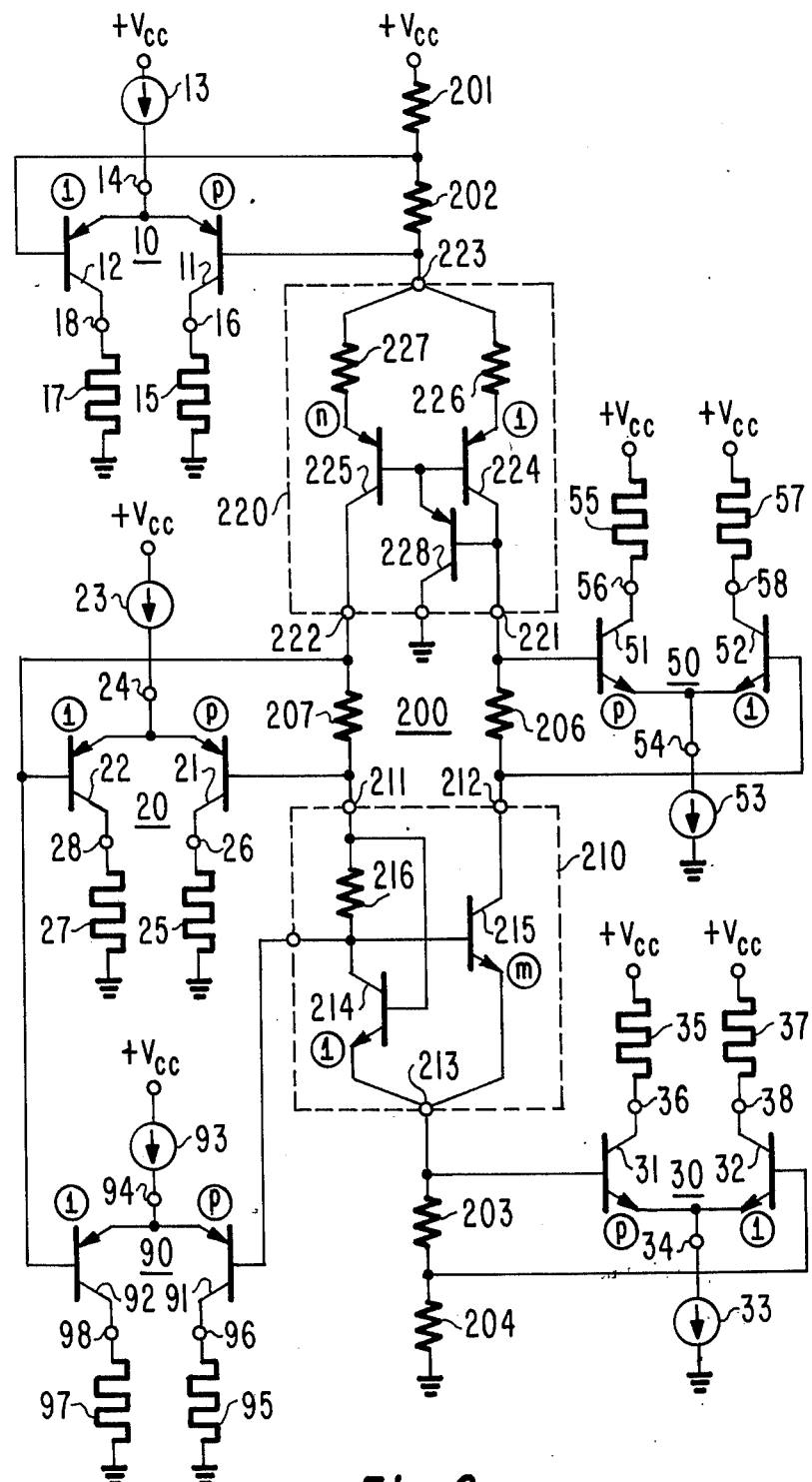
Figure 3:
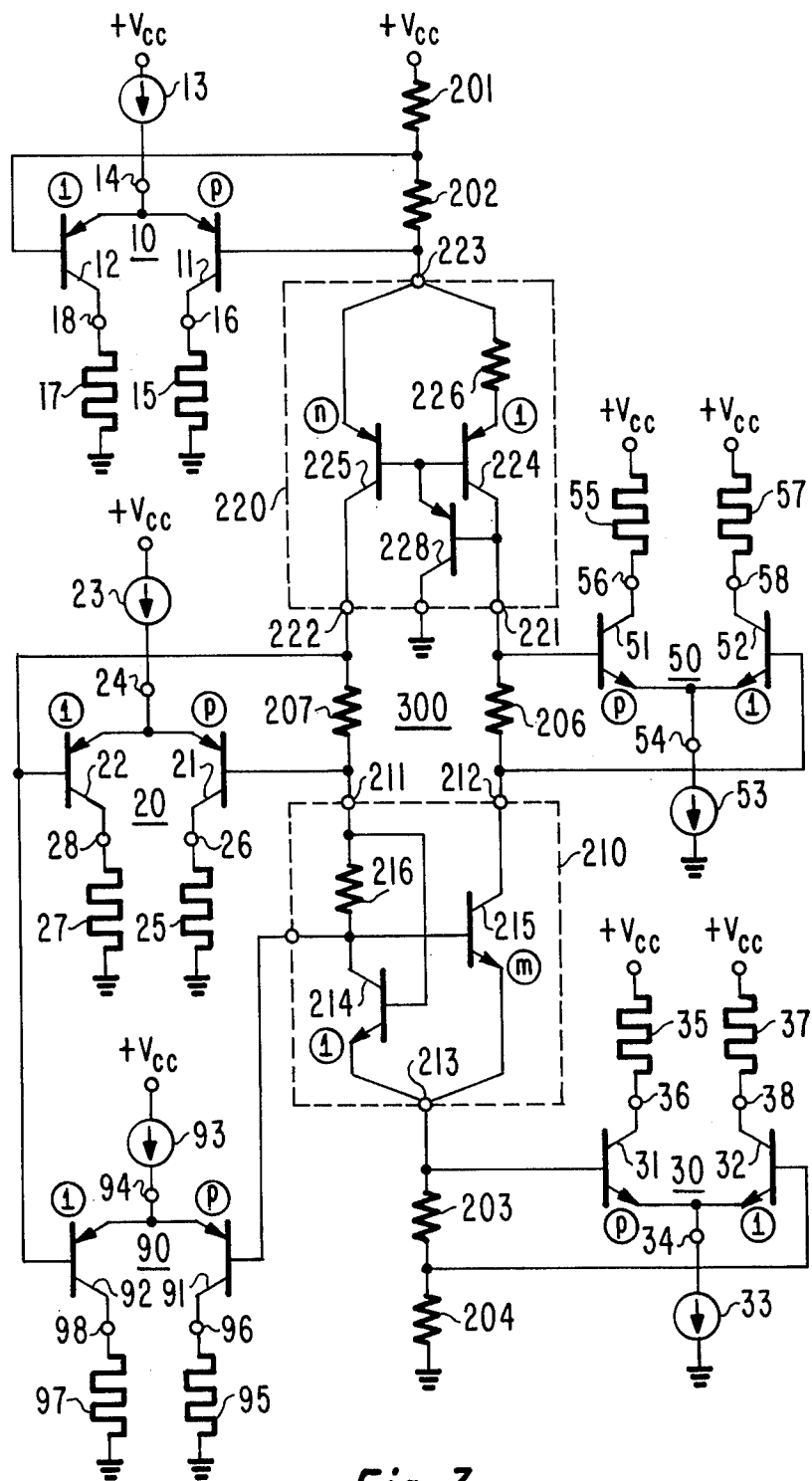
Figure 4:
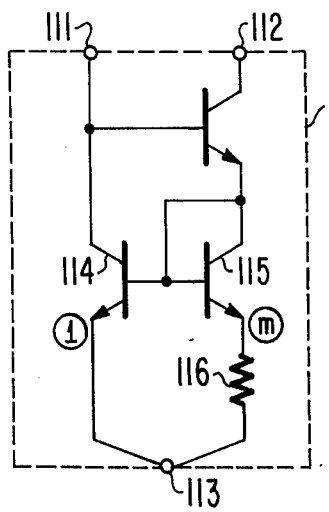
Figure 5:
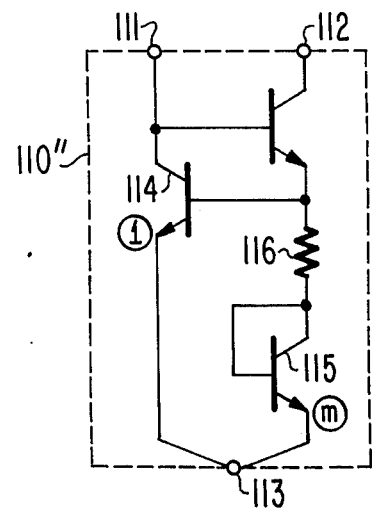
Figure 6:
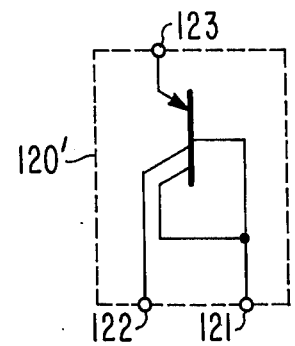
Figure 7:
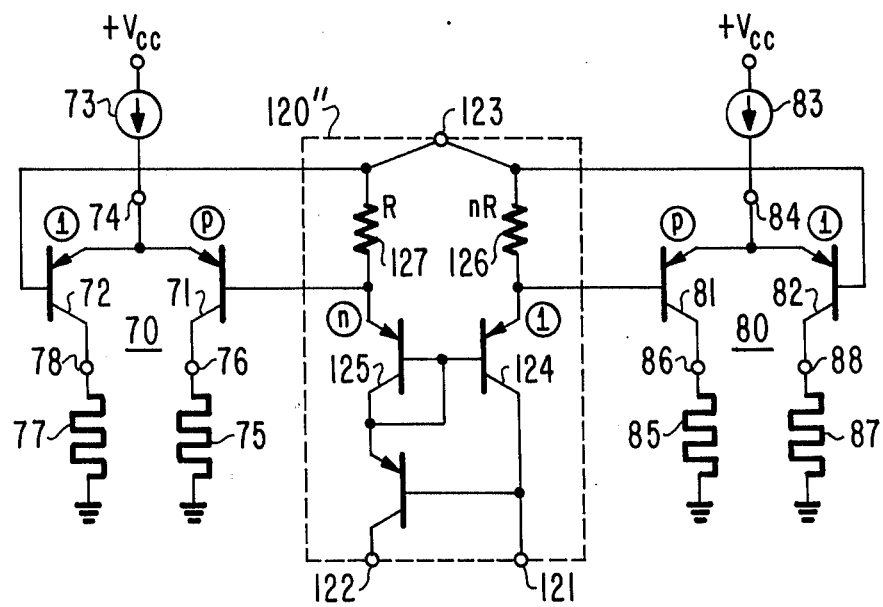

In the drawing:

FIG. 1 is a schematic diagram of pairs 10, 20, 30, 40, 50 and 60 of emitter-coupled transistors each having a potential proportional to its absolute operating temperatue T applied between the base electrodes of its transistors, which potential is developed across a resistive element (or elements) having a current (or currents) flowing therethrough regulated by a current regulator 100, according to the present invention;

each of FIGS. 2 and 3 is a schematic diagram of pairs 10, 20, 30, 50, and 90 of emitter-coupled transistors each having a potential proportional to its absolute operating temperature T applied between the base electrodes of its transistors, which potential is developed across a resistive element (or elements) having a current (or currents) flowing therethrough regulated by a current regulator, according to the present invention;

FIGS. 4 and 5 are schematic diagrams of alternative current amplifers for use in the current regulator 100 of FIG. 1;

FIG. 6 is a schematic diagram of an alternative current amplifier for use in the current regulator 100 of FIG. 1 or 200 of FIG. 2; and FIG. 7 is a schematic diagram of a alternative current amplifier suited for use in the current regulator 100 of FIG. 1 or 200 of FIG. 2 and connected according to the present invention to pairs 70 and 80 of emitter-coupled transistors.

In practicing the present invention, often the current divider circuits use current regulator 100, 200 or 300 in combination with only a single pair of emitter-coupled transistors. Mulitple pairs of emitter-coupled current dividing transistors are shown in FIGS. 1, 2 and 3, however, this being done so as to describe the various embodiments of the invention in more compact form and to facilitate comparisons between them.

In FIG. 1 current regulator 100 is included in a series connection between a positive supply potential $+V_{cc}$ and a reference ground potential. The series connection includes in order: means providing an offset potential from $+V_{cc}$ shown as an avalanche diode 101, a resistive element 102, current regulator 100, resistive element 103, and means providing an offset potential from ground shown as comprising serially-connected, forward-biased junction diodes 104 and 105.

Current regulator 100 comprises a regenerative feedback loop connection of a first current amplifier 110 and a second current amplifier 120. More particularly, the output terminal 112 of amplifier 110 is direct coupled to the input terminal 121 of amplifier 120 by means of a galvanic coupling via resistive element 106; and output terminal 122 of amplifier 120 is direct coupled to the input terminal 111 of amplifier 110 by means of a galvanic coupling via resistive elment 107. Amplifier 120 is of the type commonly referred to as a "current mirror amplifier" and exhibits a fixed current gain. Current amplifier 110 is of a modified current mirror amplifier structure, including a resistive element 116 which causes amplifier 110 to exhibit a falling current gain with increasing level of input current to its input terminal 111. Current regulator 100 maintains currents through resistors 106 and 107 which are in fixed ratio to each other and consequently to their sum. The sum of these currents flows through elements 101 and 102 to the common terminals 123 of amplifier 120 and from the common terminal 113 of amplifier 110 through elements 103, 104 and 105.

The ratios of the transconductances of a pair of PNP or NPN transistors in indicated in the drawing by small encircled figures near their emitter electrodes. These ratios can be determined by the ratios of the effective areas of the base-emitter junctions of the paired transistors. The current gain of the simple current mirror configuration 120 as between its terminals 121 and 122 is well-known to be substantially equal to $-n$, the ratio of the transconductance of its output transistor 125 to that of its input transistor 124 and to be substantially independent both of temperature and of the common-emitter forward current gains ($h_{fe}$'s) of transistors 124 and 125. At relatively low output current levels of amplifier 110, as obtain when current levels in the positive feedback loop of regulator 100 just begin to build up, the potential drop across emitter degeneration resistor 116 is negligible. Amplifier 110 behaves as a current mirror amplifier at these low output current levels and has a current gain of $-m$ as between its terminals 111 and 112. The low level open-loop gain mn of the regulator loop is chosen to be larger than unity, typically a few times larger.

The positive feedback loop formed by current amplifier 110 and 120 is not self-starting. An initial current distrubance has to be introduced into the loop, after which its regenerative properties will cause increasing current levels until the amplitude of the current gain of amplifier 110 is diminished from $-m$ to $-1/n$ and the equilibrium condition of unity loop gain obtains. This initial current disturbance can be introduced into the loop by the small leakage current through a open-based transistor as shown by Wheatley in U.S. Pat. No. 3,629,691. Alternatively, a self-extinguishing current source can be used to inject a starting current into the loop. However, the base currents of the emitter-coupled pair 10, 20, 30, 40, 50 or 60 of transistors will, if applied in the correct polarity to the current regulator 100 as in FIG. 1, suffice to initiate conduction in the positive feedback loop without special starting circuitry having to be provided.

The equilibrium conditions in the positive feedback loop connection of amplifiers 110 and 120 can be calculated proceeding from the following basic equation descriptive of transistor action.

$$V_{BE} = (kT/q) \ln (I_E/A J_S) \tag{1}$$

where;

$V_{BE}$ is the base-emitter junction potential of the transistor, $k$ is Boltzmann's constant, $T$ is absolute temperature, $q$ is the charge on an electron, $I_E$ is the emitter current of the transistor, $A$ is the area of the base-emitter junction of the transistor, and $J_S$ is density of current flow through the base-emitter junction of the transistor which is associated with saturation conditions.

Numberical subscripts for the quantities $V_{BE}$, $I_E$ and $A$ relate these quantities to the transistor bearing that identification numeral in the drawing. $J_S$ is presumed to be the same for all transistors of the same conductivity type formed by simultaneous process steps, proceeding from the same basic semiconductor material. The transistors are assumed to be at the same operating temperature by reason of being proximate on the integrated circuit die and of being afforded close thermal coupling by the low thermal resistance of the die as mounted on a header.

The base currents of the transistors in FIG. 1 are assumed to be negligible to simplify calculations; this approximation is usually a reasonably accurate one to make and those skilled in the art can readily calculate more exact results. This approximation permits one to assume combined currents $(I_1 + I_2)$ flowing to terminal 123; the $I_1$ component then flowing in the left hand branch of regulator 100 through the emitter-to-collector path of transistor 125, resistive element 107 and the collector-to-emitter path of transistor 114 to terminal 113; and the $I_2$ component flowing in the right hand branch of regulator 100 through the emitter-to-collector path of transistor 124, resistive element 106, the collector-to-emitter path of transistor 115, and resistive element 116 to terminal 113.

The potential $V_{116}$ appearing across resistive element 116 is the difference in the base-emitter offset potentials of transistors 114 and 115.

$$V_{116} = V_{BE114} - V_{BE115} \tag{2}$$

Substituting into equation 2 using equation 1, equation 3 it obtained.

$$V_{116} = (kT/q) \ln (I_1/J_S) - (kT/q) \ln (I_2/mJ_S) = (kT/q) \ln (m I_1/I_2) \tag{3}$$

At equilibrium the fixed current gain of amplifier 120 forces the following relationship of $I_1$ and $I_2$.

$$I_1 = nI_2 \tag{4}$$

Substituting equation 4 into equation 3, the equilibrium value of $V_{116}$ is obtained.

$$V_{116} = (kT/q) \ln mn \tag{5}$$

Consider a pair such as 60 of transistors connected as an emitter-coupled current splitter with the base-emitter potential $V_{BE-L}$ of the first exceeding the base-emitter potential $V_{BE-S}$ of the second by a factor of $\Delta V_{BE}$ and the effective transconductance of the first for a given current level exceeding that of the second by a factor $p$. Then, ratio of the collector current $I_{C-L}$ of the first current splitter transistor to the collector current $I_{C-S}$ of the second can be calculated.

$$\Delta V_{BE} = V_{BE-L} - V_{BE-S} \tag{6}$$

Substituting equation 1 into equation 6 yields equation 7.

$$\Delta V_{BE} = (kT/q) \ln (I_{E-L}/pJ_S) - (kT/g) \ln (I_{E-S}/J_S) = (kT/g) \ln (I_{E-L}/p I_{E-S}) \tag{7}$$

The collector currents of $I_{C-L}$ and $I_{C-S}$ of the first and second transistors are related to their respective emitter currents $I_{E-L}$ and $I_{E-S}$ by the same multiplier $\alpha$.

$$I_{C-L} = \alpha I_{E-L} \tag{8}$$

$$I_{C-S} = \alpha I_{E-S} \tag{9}$$

$$\Delta V_{BE} = (kT/q) \ln (I_{C-L}/p I_{C-S}) \tag{10}$$

Equation 10, above, descriptive of the current-divider action of an emitter-coupled pair of transistors, is obtained by substituting equations 8 and 9 into equation 7.

Equation 10 can be rewritten for particular application to emitter-coupled pair 60 as follows.

$$V_{116} = (kT/q) \ln (I_{C61}/pI_{C62}) \tag{11}$$

Eliminating $V_{116}$ between equations 5 and 11 results in equation 12, following, providing that transistors 61 and 62 are operated at substantially the same temperature as transistors 114 and 115. This condition is easily met in a monolithic integrated circuit structure if transistors 114, 115, 61 and 62 are located in proximity to each other in a portion of the die not subject to steep thermal gradients.

$$I_{C61} = mnp\, I_{C62} \tag{12}$$

So, the current demand of current source 63 placed on the common terminal 64, to which the emitter electrodes of transistors 61 and 62 are connected, causes a current $\alpha mnp/(mnp + 1)$ times as large to flow through load resistor 65 to a first branch terminal 66 and thence as collector current to transistor 61. A current $\alpha/(mnp + 1)$ times as large as the current demanded from terminal 64 flows through load resistor 67 to a second branch terminal 68 and thence as collector current to transistor 61. The current division between loads 65 and 67 is thus substantially independent of the transistor $h_{fe}$'s and of temperature. It is important to understand that this desired result comes about because the potential drop across resistive element 116 is caused to be proportional to T, the temperature at which circuit 60 is operated.

Elements associated with each of the remaining emitter-coupled transistor pairs 10, 20, 30, 40 and 50 which have corresponding functions to elements 61, 62, 63, 64, 65, 66, 67 and 68 have identification numerals with corresponding final digits. The first digit of the identification numeral is the same as the pair with which the element is associated. The same scheme of identification numerals is used in connection with the elements associated with emitter-coupled transistor pairs 70, 80 and 90 appearing in the later FIGURES of the drawing.

Since substantially the same current $I_2$ flows in resistie elements 106 and 116 by Ohm's Law, the potential drop $V_{106}$ across resistive element 106 can be defined in terms of $V_{116}$ and a ratio of the resistances $R_{106}$ and $R_{116}$ of resistive elements 106 and 116, respectively.

$$V_{106} = (R_{106}/R_{116}) V_{116} = (kT/q) (R_{106}/R_{116}) \ln mn = (kT/q) \ln (mn)^{(R_{106}/R_{116})} \quad (13)$$

Applying $V_{106}$ between the base electrodes of transistors 51 and 52 results in the following relationship between $I_{C51}$ and $I_{C52}$, the collector currents of transistors 51 and 52, respectively, providing that transistors 51 and 52 are operated at similar tempertures to those at which transistors 114 and 115 are operated.

$$I_{C51} = p(mn)^{(R_{106}/R_{116})} I_{C52} \quad (14)$$

In order to obtain a fixed ratio betwween $I_{C51}$ and $I_{C52}$, it is desirable that resistances $R_{106}$ and $R_{116}$ be in fixed ratio with each other despite temperature change and across a range of manufacture. This is not difficult to do in monolithic integrate circuit construction, providing the resistors are located in proximity to each other in a portion of the die not subject to steep thermal gradients and are formed by the same set of process steps. Very large ratios of $I_{C51}$ and $I_{C52}$ can be obtained despite $m$, $n$ and $p$ being small numbers by making $R_{106}/R_{116}$ a few times unity.

In each of the current dividers comprising current regulator 100 and any one of the current-dividing, emitter coupled transistor pairs 10, 20, 30, 40 and 50, the $\Delta V_{BE}$ potential drop across resistive element 106 is multiplied by a fixed factor and applied between the base electrodes of the emitter-coupled transistors. The fixed factor comes about because of the fixed ratio between currents in the regulator 100 and the fixed ratio of resistances as between resistive element 106 and resistive element 102, 107, 103 or 106. If the emitter-coupled transistors are operated at substantially the same temperature as transistors 114 and 115, the current division as between the emitter-to-collector paths of the emitter-coupled transistors will be by a fixed proportion.

The current $I_1$ flowing through resistive element 107 is $n$ times the currents $I_2$ flowing through resistive element 116. This observation combined with Ohm's Law leads to the following equation defining the potential drop $V_{107}$ across resistive element 107.

$$V_{107} = (nR_{107}/R_{116}) V_{116} = (kT/q) (nR_{107}/R_{106}) \ln mn = (kT/q) \ln (mn)^{(nR_{107}/R_{106})} \quad (15)$$

Applying $V_{107}$ between the base electrodes of transistors 21 and 22 results in the following relationship between $I_{C21}$ and $I_{C22}$, the collector currents of transistors 21 and 22, respectively.

$$I_{C21} = p(mn)^{(nR_{107}/R_{116})} I_{C22} \quad (16)$$

The composite current $I_1 + I_2$ flowing through resistive elements 102 and 103 is $(n+1)$ times as large as $I_1$. So the potential drop $V_{102}$ and $V_{103}$ appearing across resistive elements 102 and 103, respectively, have the following values.

$$V_{102} = [(n+1)R_{102}/R_{116}] V_{116} = (kT/q) \ln (mn)^{[(n+1)R_{102}/R_{116}]} \quad (17)$$

$$V_{103} = [(n+1)R_{103}/R_{116}] V_{116} = (kT/q) \ln (mn)^{[(n+1)R_{103}/R_{116}]} \quad (18)$$

As applied to pair 10, $V_{102}$ causes the following relationship between the collector currents $I_{C11}$ and $I_{C12}$ of transistors 11 and 12, respectively.

$$I_{C11} = p(mn)^{[(n+1)R_{102}/R_{116}]} I_{C12} \quad (19)$$

As applied to pair 30, $V_{103}$ causes the following relationship between the collector currents $I_{C31}$ and $I_{C32}$ of transistors 31 and 32, respectively.

$$I_{C31} = p(mn)^{[(n+1)R_{103}/R_{116}]} I_{C32} \quad (20)$$

The base electrodes of transistors 41 and 42 in emitter-coupled pair 40 have the sum of $V_{103}$ and $V_{116}$ applied between them, causing the following relationship between $I_{C41}$ and $I_{C42}$, their respective collector currents.

$$I_{C41} = p(mn)^{[R_{106}+(n+1)R_{103}]/R_{116}} I_{C42} \quad (21)$$

The decision by the electronics designer as to which of the current-dividing transistor pairs 10, 20, 30, 40, 50 and 60 he will use depends in larger part upon where he wishes to bias the base electrodes of the pair relative to the $+V_{cc}$ and ground potentials. Each of the pairs 10, 20, 30, 40, 50 and 60 can be replaced by a counterpart using transistors of opposite conductivity type, but this will require that provision be made for starting conduction in the positive feedback loop connection of amplifiers 110 and 120 in current regulator 110. The biasing of the current dividing transistor pair can also be altered by including further potential offsetting means in suitable connections — e.g., between resistor 102 and terminal 123, between resistor 106 and terminal 121, between resistor 107 and terminal 111, or between terminal 113 and resistor 103.

A number of modifications of the current regulator 100 are possible. Current amplifier 110 may be replaced by either current amplifier 110' of FIG. 4 or current amplifier 110'' of FIG. 5, for example. Current mirror amplifier 120 can be replaced by almost any one of the multitude of known current mirror amplifiers including those constructed with field effect transistors or dual collector transistors. Current mirror amplifier 120' of FIG. 6 uses a dual-collector transistor, and its current gain is determined by the ratio of collection efficiencies of the collector regions connected to output terminal 122 and input terminal 121. A current mirror amplifier like 120'' of FIG. 7 may replace amplifier 120. Any current mirror amplifier using the proportioned trasconductances of transistors 124 and 125 in base-to-base and emitter-to-emitter connection (or gate-to-gate and source-to-source connection) to determine its current gain can be modified to include emitter degeneration resistances 126 and 127 for transistors 124 and 125, respectively. By making resistance 126 $n$ times as large as resistance 127, where $n$ is the ratio of the area of the base-emitter junction of transistor 125 to that of transistor 124, inclusion of resistances 126 and 127 leaves current mirror amplifier current gain with an unaffected value of $-n$. Since $I_1$ and $I_2$ flow in resistances 127 and 126, respectively, the potential drop $V_{127}$ and $V_{126}$ across them due to their resistances $R_{127}$ and $R_{126}$ are proportional to $V_{116}$.

$$V_{127} = (nR_{127}/R_{116})V_{116} = (nR_{127}/R_{116})(kT/q)\ln mn = (kT/q)\ln(mn)^{(nR_{127}/R_{116})} \quad (22)$$

$$V_{126} = (R_{126}/R_{116})V_{116} = (R_{126}/R_{116})(kT/q)\ln mn = (kT/q)\ln(mn)^{(R_{126}/R_{116})} \quad (23)$$

Applying $V_{127}$ between the base electrodes of transistors 71 and 72 causes the following relationship between their respective collector currents $I_{C71}$ and $I_{C72}$.

$$I_{C71} = p(mn)^{(nR_{127}/R_{116})} I_{C72} \quad (24)$$

Applying $V_{126}$ between the base electrodes of transistors 81 and 82 causes the following relationship between their respective collector currents $I_{C81}$ and $I_{C82}$.

$$I_{C81} = p(mn)^{(R_{126}/R_{116})} I_{C82} \quad (25)$$

Also, the sum of $V_{102}$ and either $V_{126}$ or $V_{127}$ may be applied to the base electrodes of a pair of emitter-coupled transistors to provide for well-defined current division.

In FIG. 2, current regulator 200 is included in a series connection between $+V_{cc}$ and reference ground potential, including in order: means for providing an offset potential from $+V_{cc}$ shown as a resistive element 201, a resistive element 202, current regulator 200, and means providing an offset potential from ground shown as resistive element 204. Current regulator 200 comprises a positive feedback loop connection of a first current amplifier 210, which exhibits a current gain $-H$, which decreases from an initial value $-m$ with increasing level of input current to its input terminal 211, and of a second current amplifier 220. Amplifier 220 may be any one of the multitude of current amplifiers commonly referred to as "current mirror amplifiers" which exhibits a fixed current gain $-n$. Preferably, however, current amplifier 220 comprises a structure similar to that of a current mirror amplifier using transistors with parallelled base-emitter circuits for determining its current gain, but in which the transistor galvanically coupled to the input terminal of the amplifier has more emitter degeneration than does the transistor galvanically coupled to the output terminal of the current amplifier. This modified structure results in a current amplifier 220 having a current gain $-G$ which increases from a initial value of $-n$ with increasing input current to its input terminal 221.

The positive feedback loop connection of amplifiers 210 and 220 comprises a direct coupling of the output terminal 212 of amplifier 210 to the input terminal 221 of amplifier 220, this coupling shown as a galvanic coupling via resistive element 206, and the direct coupling of the output terminal 222 of amplifier 220 to the input terminal 211 of amplifier 210, this latter coupling shown as a galvanic coupling via resistive element 207.

The open-loop gain of the loop at low current levels has a value $mn$, which is chosen larger than unity so there will be a tendency for a initial current disturbance in the loop to grow by regeneration. Growth of currents in the loops continues until the potential drop $V_{216}$ across resistive element 216 is of sufficient value that $-H$, the current gain of amplifier 210, is decreased to substantially equal the reciprocal of $-G$, the current gain of amplifier 220. The the equilibrium condition of unity loop gain obtains.

Equilibrium obtains for specific values of $I_3$ and $I_4$, $I_3$ being the current flow through the left half of the current regulator 200 and $I_4$ the current flow through its right half. More particularly, a current substantially equal to $(I_3+I_4)$ flows from the $+V_{cc}$ terminal through resistive elements 201 and 202 to the common terminal 223 of amplifier 220. $I_3$ flows from terminal 223 through resistive element 227 (or the direct connection that may replace it), the emitter-to-collector path of transistor 225, resistive elements 207 and 216, and the collector-to-emitter path of transistor 214 to the common terminal 213 of amplifier 210. $I_4$ flows through resistive element 226, the emitter-to-collector path of transistor 224, resistive element 206, and the collector-to-emitter path of transistor 215 to terminal 213. A current substantially equal to $(I_3+I_4)$ flows from terminal 213 through resistive elements 203 and 204 to ground. Responsive to the flow of current $I_3$ through its resistance $R_{216}$, a potential drop $V_{216}$ appears across element 216.

$$V_{216} = I_3 R_{216} = V_{BE214} - V_{BE215} = (kT/q)\ln(I_3/J_S) - (kT/q)\ln(I_4/mJ_S) = (kT/q)\ln(mI_3/I_4) \quad (26)$$

Where the emitter degeneration resistances 226 and 227 have resistance values of $R_{226}$ and $R_{227} = R_{226}/n$, respectively, amplifier 220 is a current mirror amplifier of the type described by Cope in U.S. Pat. No. 3,566,289. It has a current gain, $-G$, which is invariably $-n$ and forces $I_3/I_4$ to equal $n$. Where amplifier 220 is a current mirror amplifier $V_{216}$ obeys equation 27.

$$V_{216} = (kT/q)\ln mn \quad (27)$$

$$V_{207} = (R_{207}/R_{216})(kT/q)\ln mn = (kT/q)\ln(mn)^{(R_{207}/R_{216})} \quad (28)$$

$$V_{206} = (R_{206}/nR_{216})(kT/q)\ln mn = (kT/q)\ln(mn)^{(R_{206}/nR_{216})} \quad (29)$$

$$V_{202} = [(n+1)R_{202}/nR_{216}]\ln mn = (kT/q)\ln(mn)^{[(n+1)R_{202}/nR_{216}]} \quad (30)$$

$$V_{203} = [(n+1)R_{203}/nR_{216}]\ln mn = (kT/q)\ln(mn)^{[(n+1)R_{203}/nR_{216}]} \quad (31)$$

Equations 28–31 are obtained by application of Ohm's Law, remembering $I_4 = I_3/n$ and deducing $I_3 + I_4 = (n+1)I_3/n$. These potential drops are applied to pairs 10, 20, 30, 50, and 90 of emitter-coupled transistors with the following results, providing the pairs are operated at substantially the same temperature as transistors 214 and 215.

$$I_{C11} = p(mn)^{[(n+1)R_{202}/nR_{216}]} I_{C12} \quad (32)$$

$$I_{C21} = p(mn)^{(R_{207}/R_{216})} I_{C22} \quad (33)$$

$$I_{C31} = p(mn)^{[(n+1)R_{203}/nR_{216}]} I_{C32} \quad (34)$$

$$I_{C51} = p(mn)^{(R_{206}/nR_{216})} I_{C52} \quad (35)$$

$$I_{C91} = p(mn)^{[1+(R_{207}/R_{216})]} I_{C92} \quad (36)$$

$I_{C91}$ and $I_{C92}$ are the collector currents of transistors 91 and 92, respectively.

In FIG. 3, current regulator 300 differs from current regulator 200 in that resistive element 227 is replaced by a direct connection. Appropriate amplitudes $G_E$ and $H_E$ for the equilibrium values of $-G$ and $-H$, respectively, are decided upon at the outset of the circuit design, $G_E$ being larger than $n$ and $H_E$ being smaller than $m$. $G_E$ and $H_E$ must be reciprocals of each other to satisfy the criterion of unity loop gain required for equilibrium. Equations 25 through 34, with $G_E$ substituted for $n$ will describe the operation of FIG. 3.

As might be expected in light of the foregoing description, values of $R_{227}$ intermediate zero and $R_{226}/n$ will also result in useful current divider configurations. Current regulators, usually with somewhat poorer current regulation than the types described, can be built wherein:

a. current mirror amplifier 120 in regulator 100 is replaced with a current amplifier exhibiting rising current gain with increasing input current level as described in connection with current regulators 200 and 300; or b. current amplifier 120 in regulator 100 or current amplifier 220 in regulator 200 is replaced with a current amplifier exhibiting falling current gain with increasing input current level such as current amplifier 110. A pair of emitter-coupled current divider transistors may have their base potentials offset from each other by the potential drop across the emitter degeneration resistance 226 or 227.

Many other embodiments of the invention will occur to the skilled electronic circuits designer in light of the teaching of this application, and the claims should be construed accordingly. For example, the transistors in an emitter-coupled current-dividing pair may be composite transistors comprising like-numbered pluralities of transistors in Darlington configuration to reduce base current errors.

What is claimed is:

1. Apparatus for providing a bias potential proportional to an absolute temperature T comprising:
   first and second terminals for receiving an operating potential therebetween;
   a first resistance;
   a first current amplifier having an input terminal and an output terminal, a common terminal connected to said first terminal, first and second transistors of a first conductivity type, both operated at absolute temperatures substantially equal to T, each of said first and second transistors having base and emitter electrodes with a base-emitter semiconductor junction therebetween, means galvanically coupling said first transistor collector electrode and said first current amplifier input terminal, means galvanically coupling said second transistor collector electrode and said first current amplifier output terminal, means consisting of a direct connection without substantial impedance between said first transistor emitter electrode and said first current amplifier common terminal, means direct coupling said first transistor collector electrode to said first transistor base electrode for applying direct coupled feedback to said first transistor to regulate the potential across its base-emitter junction to a value conditioning said first transistor for conducting substantially all of any current applied to said first current amplifier input terminal, a first resistance, and a series connection of said first resistance and said second transistor base-emitter junction, to which the regulated potential across the base-emitter junction of said first transistor is applied; and
   a second current amplifier having a input terminal and an output terminal, a common terminal connected to said second terminal, third and fourth transistors of a second conductivity type complementary to said first conductivity type, each of said third and fourth transistors having a principal conduction path between first and second electrodes thereof and having a control electrode, the potential appearing between the control and first electrodes of each of said third and fourth transistors controlling the conduction of current in its principal conduction path, means direct coupling said second current amplifier input terminal to said third transistor control electrode, means galvanically coupling the first electrode of said third transistor to said second current amplifier common terminal, means galvanically coupling the second electrode of said third transistor to said second current amplifier input terminal, means direct coupling said second current amplifier input terminal to said fourth transistor control electrode, means galvanically coupling the first electrode of said fourth transistor to said second current amplifier common terminal, and means galvanically coupling the second electrode of said fourth transistor to said second current amplifier output terminal; and
   means connecting said first and second current amplifiers in a regenerative feedback loop including:
   a first direct current path from the output terminal of said first current amplifier to the input terminal of said second current amplifier;
   a second direct current path from the output terminal of said second current amplifier to the input terminal of said first current amplifier; and
   a second resistance included in one of the first and second direct current paths, said second resistance being in fixed ratio with said first resistance, the aforesaid connections of elements cooperating to cause the potential drop across said second resistance to be proportional to the absolute temperature T.

2. Apparatus as set forth in claim 1 having in combination therewith current dividing means comprising a pair of emitter-coupled transistors with their respective base electrodes connected to opposite ends of said second resistance.

3. Apparatus as set forth in claim 1 wherein said means galvanically coupling said first transistor collector electrode and said first current amplifier input terminal includes said first resistance;
   said second resistance is included in said second direct current path, and said first and said second resistances have respective first ends directly connected without substantial intervening impedance to said first current amplifier input terminal and have respective second ends between which appears a potential drop proportional to the absolute temperature T.

4. Apparatus as set forth in claim 3 having in combination therewith current dividing means comprising a pair of emitter-coupled transistors with their respective base electrodes respectively connected to the second end of said second resistance.

5. A current divider comprising:
a common terminal for receiving a current to be divided;
first and second branch terminals for supplying portions of the received current;
first and second transistors being of the same basic semiconductor material, having respective base electrodes, having respective emitter electrodes connected to said common terminal, having respective collector electrodes respectively connected to separate ones of said first and said second branch terminals, being operated at substantially the same absolute temperature T, and being of the same conductivity type;
a first resistive element having a first end to which said first transistor base electrode is connected and having a second end to which said second transistor base electrode is connected; and
means, independent of and not including said first and said second transistors and not being responsive to their respective collector current flows, for supplying a current responsive to T, connected between the first and second ends of said first resistive element to develop a potential drop substantially proportionally responsive to T between its said first and second ends, thereby causing division of a current received at said common terminal into first and second portions in predetermined ratio to each other, which portions flow as the respective emitter currents of said first and said second transistors for determining their respective collector current flows.

6. A current divider as claimed in claim 5 wherein said means for supplying a current responsive to T comprises:
third and fourth transistors, being of said same basic semiconductor material, having respective base and emitter and collector electrodes, and being operated at substantially said absolute temperature T;
means for maintaining respective emitter current flows through said third and said fourth transistors which are in a temperature-independent first ratio to each other, said first ratio so chosen as to cause the emitter-base offset potentials of said third and said fourth transistors to differ by a difference potential, which difference potential is perforce linearly proportional to T;
a second resistive element having a resistance in a temperature-independent second ratio to the resistance of said first resistive element, and having said difference potential applied between its ends to cause a current therethrough; and
means for supplying a response current linearly proportional to the current through said second resistive element, connected for causing said response current to flow through said first resistive element, thereby to develop said potential drop proportionally responsive to T between its said first and said second ends.

7. A current divider as set forth in claim 5 wherein said means for supplying a current responsive to T includes:
means for supplying an operating potential between first and second supply terminals;
a first current amplifier including an input terminal, an output terminal, a common terminal, third and fourth transistors of a first conductivity type each with base and emitter and collector electrodes, first galvanic coupling means between said third transistor collector electrode and said first current amplifier input terminal, second galvanic coupling means consisting of a direct connection without substantial intervening impedance between said third transistor emitter electrode and said first current amplifier common terminal, means direct coupling said first current amplifier input terminal to said third transistor base electrode, means direct coupling said first current amplifier input terminal to said fourth transistor base electrode, third galvanic coupling means between said fourth transistor emitter electrode and said first current amplifier common terminal, fourth galvanic coupling means between said fourth transistor collector electrode and said first current amplifier output terminal, and a second resistive element exhibiting a resistance proportional to that of said first resistive element despite changes in their substantially same operating temperatures, said second resistive element being included in one of said first and said third galvanic coupling means;
a second current amplifier including an input terminal, an output terminal, a common terminal, fifth and sixth transistors of a second conductivity type each with base and emitter and collector electrodes, fifth galvanic coupling means between said fifth transistor collector electrode and said second current amplifier input terminal, sixth galvanic coupling means between said fifth transistor emitter electrode and said second current amplifier common terminal, means direct coupling said second current amplifier input terminal to said fifth transistor base electrode, means direct coupling said second current amplifier input terminal to said sixth transistor base electrode, seventh galvanic coupling means between said sixth transistor emitter electrode and said second current amplifier common terminal, and eighth galvanic coupling means between said sixth transistor collector electrode and said second current amplifier output terminal, said first and second conductivity types being complementary to each other;
ninth galvanic coupling means between said first supply terminal and said first current amplifier common terminal;
tenth galvanic coupling means between said second supply terminal and said second current amplifier supply terminal;
eleventh galvanic coupling means between said first current amplifier output terminal and said second current amplifier input terminal; and
twelfth galvanic coupling means between said second current amplifier output terminal and said first current amplifier input terminal,
said first resistive element being included in one of said galvanic coupling means other than the second.

8. A current divider as set forth in claim 5 wherein said means for supplying a current responsive to T includes:
means for supplying an operating potential between first and second supply terminals;
a first current amplifier including an input terminal, an output terminal, a common terminal, third and fourth transistors of a first conductivity type each with base and emitter and collector electrodes, first galvanic coupling means between said third transistor collector electrode and said first current amplifier input terminal, second galvanic coupling means consisting of a direct connection without substantial intervening impedance between said third transistor emitter electrode and said first current amplifier common terminal, means direct coupling said first current amplifier input terminal to said third transistor base electrode, means direct coupling said first current amplifier input terminal to said fourth transistor base electrode, third galvanic coupling means between said fourth transistor emitter electrode and said first current amplifier common terminal, fourth galvanic coupling means between said fourth transistor collector electrode and said first current amplifier output terminal, and a second resistive element exhibiting a resistance proportional to that of said first resistive element despite changes in their substantially same operating temperatures, said second resistive element being included in one of said first and said third galvanic coupling means;

a second current amplifier including an input terminal, an output terminal, a common terminal, a fifth dual-collector transistor of a second conductivity type having an emitter and a base electrode as well as first and second collector electrodes, fifth galvanic coupling means between the first collector electrode of said fifth transistor and said second current amplifier input terminal, sixth galvanic coupling means between said fifth transistor emitter electrode and said second current amplifier common terminal, means direct coupling said second current amplifier input terminal to said fifth transistor base electrode, and seventh galvanic coupling means between the first collector electrode of said fifth transistor and said second current amplifier output terminal, said first and said second conductivity types being complementary to each other;

eighth galvanic coupling means between said first supply terminal and said first current amplifier common terminal;

ninth galvanic coupling means between said second supply terminal and said second current amplifier supply terminal;

tenth galvanic coupling means between said first current amplifier output terminal and said second current amplifier input terminal; and eleventh galvanic coupling means between said second current amplifier output terminal and said first current amplifier input terminal, said first resistive element being included in one of said galvanic coupling means other than the second.

9. A current divider as set forth in claim 5 wherein said means for supplying a current responsive to T includes:

means for supplying an operating potential between first and second supply terminals;

a first current amplifier including an input terminal, an output terminal, a common terminal, third and fourth transistors of a first conductivity type each with base and emitter and collector electrodes, first galvanic coupling means between said third transistor collector electrode and said first current amplifier input terminal, second galvanic coupling means consisting of a direct connection without substantial intervening impedance between said third transistor emitter electrode and said first current amplifier common terminal, means direct coupling said first current amplifier input terminal to said third transistor base electrode, means direct coupling said first current amplifier input terminal to said fourth transistor base electrode, third galvanic coupling means between said fourth transistor emitter electrode and said first current amplifier common terminal, fourth galvanic coupling means between said fourth transistor collector electrode and said first current amplifier output terminal, and said first resistive element, said first resistive element being included in one of said first and said third galvanic coupling means;

a second current amplifier including an input terminal, an output terminal, a common terminal, fifth and sixth transistors of a second conductivity type each with base and emitter and collector electrodes, fifth galvanic coupling means between said fifth transistor collector electrode and said second current amplifier input terminal, sixth galvanic coupling means between said fifth transistor emitter electrode and said second current amplifier common terminal, means direct coupling said second current amplifier input terminal to said fifth transistor base electrode, means direct coupling said second current amplifier input terminal to said sixth transistor base electrode, seventh galvanic coupling means between said sixth transistor emitter electrode and said second current amplifier common terminal, and eighth galvanic coupling means between said sixth transistor collector electrode and said second current amplifier output terminal, said first and second conductivity types being complementary to each other;

ninth galvanic coupling means between said first supply terminal and said first current amplifier common terminal;

tenth galvanic coupling means between said second supply terminal and said second current amplifier supply terminal;

eleventh galvanic coupling means between said first current amplifier output terminal and said second current amplifier input terminal; and twelfth galvanic coupling means between said second current amplifier output terminal and said first current amplifier input terminal.

10. A current divider as set forth in claim 5 wherein said means for supplying a current responsive to T includes:

means for supplying an operating potential between first and second supply terminals;

a first current amplifier including an input terminal, an output terminal, a common terminal, third and fourth transistors of a first conductivity type each with base and emitter and collector electrodes, first galvanic coupling means between said third transistor collector electrode and said first current amplifier input terminal, second galvanic coupling means consisting of a direct connection without substantial intervening impedance between said third transistor emitter electrode and said first current amplifier common terminal, means direct coupling said first current amplifier input terminal to said third transistor base electrode, means direct coupling said first current amplifier input terminal to said fourth transistor base electrode, third galvanic coupling means between said fourth transistor emitter electrode and said first current amplifier common terminal, fourth galvanic coupling means between said fourth transistor collector electrode and said first current amplifier output terminal, and said first resistive element, said first resistive element being included in one of said first and said third galvanic coupling means;

a second current amplifier including an input terminal, an output terminal, a common terminal, a fifth dual-collector transistor of a second conductivity type having an emitter and a base electrode as well as first and second collector electrodes, fifth galvanic coupling means between the first collector electrode of said fifth transistor and said second current amplifier input terminal, sixth galvanic coupling means between said fifth transistor emitter electrode and said second current amplifier common terminal, means direct coupling said second current amplifier input terminal to said fifth transistor base electrode, and seventh galvanic coupling means between the first collector electrode of said fifth transistor and said second current amplifier output terminal, said first and said second conductivity types being complementary to each other;

eighth galvanic coupling means between said first supply terminal and said first current amplifier common terminal;

ninth galvanic coupling means between said second supply terminal and said second current amplifier supply terminal;

tenth galvanic coupling means between said first current amplifier output terminal and said second current amplifier input terminal; and eleventh galvanic coupling means between said second current amplifier output terminal and said first current amplifier input terminal.

11. A current divider comprising:

first and second and third and fourth transistors, all being of the same basic semiconductor material and being operated at substantially the same absolute temperature, each having base and emitter and collector electrodes, each having an emitter-base junction between its emitter and base electrodes, and each having a collector-base junction between its collector and base electrodes, said first and said second transistors being of the same conductivity type as each other, and said third and said fourth transistors being of the same conductivity type as each other;

a common terminal to which the emitter electrodes of said first and said second transistors are directly connected without substantial intervening impedance;

first and second branch terminals to which the collector electrodes of said first and said second transistors are respectively connected;

means for applying an input current between said common terminal and another circuit node, said input current of a polarity to cause emitter current responses in said first and said second transistors;

first and second conductive paths connecting said other circuit node to said first and said second branch terminals, respectively;

load means included in one of said first and said second conductive paths;

means connecting said third and said fourth transistors to conduct respective emitter currents in a predetermined first ratio independent of temperature, thereby to cause the offset potentials across their respective base-emitter junctions to differ by a well-defined difference potential linearly proportional to said substantially same absolute temperature at which said first and second and third and fourth transistors are operated;

means for scaling up from said difference potential by a fixed scale factor to obtain a potential applied between the base electrodes of said first and said second transistors, thereby to maintain their respective emitter current responses to be in a second ratio independent of temperature; and means biasing the base electrode of said first transistor relative to said other circuit node to reverse-bias the collector-base junctions of each of said first and said second transistors, whereby the respective collector current responses of said first and said second transistors are related in like ratio to their emitter current responses.

* * * * *

UNITED STATES PATENT OFFICE
CERTIFICATE OF CORRECTION

PATENT NO. : 4,025,842

DATED : May 24, 1977

INVENTOR(S) : Brian Crowle

It is certified that error appears in the above-identified patent and that said Letters Patent are hereby corrected as shown below:

Column 1, line 13, "useds" should read -- uses --.
Column 1, line 41, "afforeded" should read -- afforded --.
Column 2, line 46, "in" (first occurrence) should read -- is --
Column 3, line 1, "distrubance" should read -- disturbance --.
Column 3, line 7, "a" should read -- an --.
Column 3, line 35, "numberical" should read -- numerical --.
Column 3, line 68, "it" should read -- is --.
Column 4, line 20, after "Then," insert -- the --.
Column 4, line 27, "(kT/g)" should read -- (kT/q) --.
Column 4, line 28, "(kT/g)" should read -- (kT/q) --.
Column 5, line 61, "currents" should read -- current --.
Column 6, equation (19), correct the exponent "(n 1)" to read -- (n+1) --.
Column 6, equation (20), correct the exponent "(n 1)" to read -- (n+1) --.
Column 6, equation (21), correct the exponent "(n 1)" to read -- (n+1) --.
Column 6, line 38, "larger" should read -- large --.
Column 6, line 66, "trasconductances" should read -- transconductances --.
Column 7, line 57, "a" should read -- an --.

UNITED STATES PATENT OFFICE
CERTIFICATE OF CORRECTION

PATENT NO. : 4,025,842

DATED : May 24, 1977

INVENTOR(S) : Brian Crowle

It is certified that error appears in the above-identified patent and that said Letters Patent are hereby corrected as shown below:

Column 8, line 1, "a" should read -- an --.
Column 8, line 7, "The" should read -- Then --.
Column 10, line 5, "a" (second occurrence) should read -- an --.

Signed and Sealed this

Fifteenth Day of November 1977

[SEAL]

Attest:

RUTH C. MASON
*Attesting Officer*

LUTRELLE F. PARKER
*Acting Commissioner of Patents and Trademarks*

UNITED STATES PATENT OFFICE
CERTIFICATE OF CORRECTION

PATENT NO. : 4,025,842

DATED : May 24, 1977

INVENTOR(S) : Brian Crowle

It is certified that error appears in the above-identified patent and that said Letters Patent are hereby corrected as shown below:

Column 5, line 48 "106" should read --116--.
Column 5, line 53 "106" should read --116--.

Signed and Sealed this

Twenty-third Day of May 1978

[SEAL]

Attest:

RUTH C. MASON
*Attesting Officer*

LUTRELLE F. PARKER
*Acting Commissioner of Patents and Trademarks*